(12) United States Patent
Yoon et al.

(10) Patent No.: US 10,305,042 B2
(45) Date of Patent: May 28, 2019

(54) ORGANIC LIGHT EMITTING DIODE AND ORGANIC LIGHT EMITTING DIODE DISPLAY INCLUDING THE SAME

(71) Applicant: SAMSUNG DISPLAY CO., LTD., Yongin-si, Gyeonggi-do (KR)

(72) Inventors: Seok Gyu Yoon, Seoul (KR); Dong Chan Kim, Hwaseong-si (KR); Eung Do Kim, Seoul (KR); Bo Ra Jung, Seongnam-si (KR); Kyu Hwan Hwang, Yongin-si (KR); Sung Chul Kim, Seongnam-si (KR); Won-Jong Kim, Suwon-si (KR); Young-Woo Song, Suwon-si (KR); Jong Hyuk Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 301 days.

(21) Appl. No.: 14/833,020

(22) Filed: Aug. 21, 2015

(65) Prior Publication Data

US 2016/0211460 A1    Jul. 21, 2016

(30) Foreign Application Priority Data

Jan. 19, 2015    (KR) ........................ 10-2015-0008682

(51) Int. Cl.
*H01L 51/52*    (2006.01)
*H01L 51/00*    (2006.01)
*H01L 51/50*    (2006.01)

(52) U.S. Cl.
CPC ...... *H01L 51/0061* (2013.01); *H01L 51/0059* (2013.01); *H01L 51/5092* (2013.01); *H01L 51/5231* (2013.01); *H01L 51/5265* (2013.01); *H01L 51/0072* (2013.01); *H01L 51/0073* (2013.01); *H01L 51/0074* (2013.01)

(58) Field of Classification Search
CPC ........................ H01L 51/0059; H01L 51/5092
See application file for complete search history.

(56) References Cited

U.S. PATENT DOCUMENTS

| 2002/0185969 A1* | 12/2002 | Raychaudhuri ..... H01L 51/5221 313/506 |
| 2011/0134019 A1* | 6/2011 | Lee ..................... H01L 27/3213 345/76 |
| 2013/0313527 A1 | 11/2013 | Kim |

(Continued)

FOREIGN PATENT DOCUMENTS

| CN | 102157541 A | 8/2011 |
| CN | 102655164 A | 9/2012 |

(Continued)

*Primary Examiner* — Robert T Huber
*Assistant Examiner* — Geoffrey H Ida
(74) *Attorney, Agent, or Firm* — Lewis Roca Rothgerber Christie LLP

(57) ABSTRACT

An organic light emitting diode includes: a first electrode; a second electrode facing the first electrode; a light emission layer between the first electrode and the second electrode; an electron injection layer between the second electrode and the light emission layer; and a buffer layer between the electron injection layer and the second electrode, where the electron injection layer includes a dipolar material and a first metal, and the buffer layer includes a metal having a work function of 4.0 eV or less.

24 Claims, 6 Drawing Sheets

(56) References Cited

U.S. PATENT DOCUMENTS

2015/0325803 A1* 11/2015 Lee ..................... H01L 51/442
  257/40
2016/0163994 A1* 6/2016 Park ..................... C09K 11/06
  257/40

FOREIGN PATENT DOCUMENTS

| KR | 10-0766947 B1 | 10/2007 |
| KR | 10-2008-0061732 A | 7/2008 |
| KR | 10-2011-0137087 A | 12/2011 |
| WO | WO 2013/154355 A1 | 10/2013 |

* cited by examiner

FIG. 4

| | BUFFER LAYER | ELECTRON INJECTION LAYER | CATHODE | EFFICIENCY cd/A/y | CURRENT DENSITY (mA/cm2) | METHOD OF FORMING THIN FILM |
|---|---|---|---|---|---|---|
| COMPARATIVE EXAMPLE 1 | - | Liq | MgAg | 65 | $1*10^{-4}$ | VTE |
| COMPARATIVE EXAMPLE 2 | - | Yb | Ag (90Å) | 71.5 | $1*10^{-4}$ | VTE |
| COMPARATIVE EXAMPLE 3 | - | Yb:LiF | Ag (90Å) | 76.7 | $1*10^{-4}$ | VTE |
| COMPARATIVE EXAMPLE 4 | LiF | Yb | Ag (90Å) | 78 | $1*10^{-4}$ | VTE |
| COMPARATIVE EXAMPLE 5 | Yb:LiF (20 angstrom(Å)) | Yb(50Å) | Ag (150Å) | 76.5 | $1*10^{-4}$ | VTE |
| EXAMPLE | Yb:LiF (20 angstrom(Å)) | Yb(50Å) | Ag (150Å) | 84.9 | $1*10^{-4}$ | Sputtering |

ORGANIC LIGHT EMITTING DIODE AND ORGANIC LIGHT EMITTING DIODE DISPLAY INCLUDING THE SAME

CROSS-REFERENCE TO RELATED APPLICATION

This application claims priority to and the benefit of Korean Patent Application No. 10-2015-0008682 filed in the Korean Intellectual Property Office on Jan. 19, 2015, the entire contents of which are incorporated herein by reference.

BACKGROUND

1. Field

Embodiments of the present disclosure relate to an organic light emitting diode and an organic light emitting diode display including the same.

2. Description of the Related Art

Recently, monitors, televisions, and the like, have been made to have light weight and thin thickness. In accordance with recent demand, cathode ray tube (CRT) displays have been replaced with liquid crystal displays (LCD). However, the LCD is a light-emitting/receiving device requiring a separate backlight and has limitations in view of a response speed, a viewing angle, and the like. An organic light emitting diode display in which a viewing angle is wide, contrast is excellent, and a response time is rapid has received great attention as a self-light emitting type (kind) of display device capable of overcoming the above-described recent limitations of LCDs. The organic light emitting diode display includes an organic light emitting diode for emitting light, wherein in the organic light emitting diode, electrons injected from one electrode and holes injected from the other electrode are coupled in a light emission layer to form an exciton, and the exciton emits light while releasing energy. According to the related art, a cathode is used as an electrode of the organic light emitting diode and a thermal evaporation method is performed to form the cathode. However, the thermal evaporation method has a difficulty of being applied in a large area apparatus due to a warpage phenomenon of a glass and a mask. The above information disclosed in this Background section is only for enhancement of understanding of the background of the present disclosure and therefore it may contain information that does not form the prior art that is already known in this country to a person of ordinary skill in the art.

SUMMARY

Embodiments of the present disclosure have been made in an effort to provide an organic light emitting diode, and an organic light emitting diode display including the same, having features of having high light emitting efficiency by securing stability of the organic light emitting diode in a large area apparatus.

An example embodiment of the present disclosure provides an organic light emitting diode including: a first electrode and a second electrode facing each other; a light emission layer between the first electrode and the second electrode; an electron injection layer between the second electrode and the light emission layer; and a buffer layer between the electron injection layer and the second electrode, wherein the electron injection layer includes a dipolar material and a first metal, and the buffer layer includes a metal having a work function of 4.0 eV or less.

The dipolar material and the first metal may be co-deposited to form one layer.

The first metal may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

The second electrode may include at least one selected from the group consisting of Ag, Al, Mg, Cr, Mn, Fe, Co, Ni, Cu, In, Sn, Ru, Mo, and Nb.

The buffer layer may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm and Lu.

The buffer layer may include an alloy of at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu, and at least one selected from the group consisting of Ag, Al, Mg, Cr, Mn, Fe, Co, Ni, Cu, In, Sn, Ru, Mo, and Nb.

The dipolar material may be a combination of a first component and a second component having different polarities, the first component including one selected from the group consisting of alkali metals, alkaline earth metals, rare earth metals and transition metals of the periodic table, and the second component including a halogen.

The organic light emitting diode may further include an electron transport layer between the light emission layer and the electron injection layer and a hole transport layer between the light emission layer and the first electrode, wherein the hole transport layer and the electron transport layer may each independently include an organic material.

The light emission layer may include a red light emission layer, a green light emission layer and a blue light emission layer, and further include an auxiliary layer below the blue light emission layer.

The organic light emitting diode may further include a red resonance auxiliary layer below the red light emission layer and a green resonance auxiliary layer below the green light emission layer.

The auxiliary layer may include a compound represented by Chemical Formula 1 below:

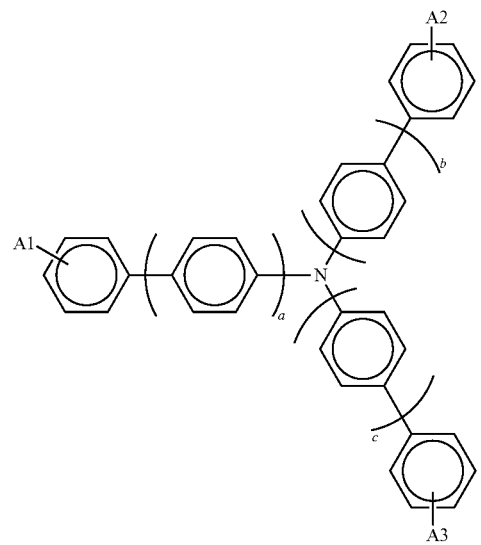

Chemical Formula 1

In Chemical Formula 1, each of A1, A2 and A3 may include an alkyl group, an aryl group, a carbazole group, a dibenzothiophene group, a dibenzofuran (DBF) group, or a biphenyl group, and each of a, b, and c may be an integer of 0 to 4.

The auxiliary layer may include a compound represented by Chemical Formula 2 below:

Chemical Formula 2

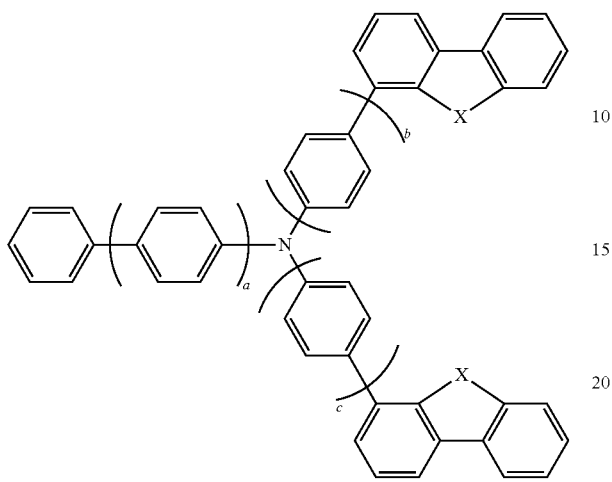

In Chemical Formula 2, a is 0 to 3, each of b and c may be 0 to 3, and X is selected from O, N or S, and each X is the same as or different from each other X.

Another embodiment of the present disclosure provides an organic light emitting diode display including: a substrate; a thin film transistor on the substrate; and an organic light emitting diode on the thin film transistor and coupled to the thin film transistor, where the organic light emitting diode includes: a first electrode; a second electrode facing the first electrode; a light emission layer between the first electrode and the second electrode; an electron injection layer between the second electrode and the light emission layer, and a buffer layer between the electron injection layer and the second electrode, the electron injection layer including a dipolar material and a first metal, and the buffer layer including a metal having a work function of 4.0 eV or less.

The dipolar material and the first metal may be co-deposited to form one layer.

The first metal may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

The second electrode may include at least one selected from the group consisting of Ag, Al, Mg, Cr, Mn, Fe, Co, Ni, Cu, In, Sn, Ru, Mo, and Nb.

The buffer layer may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

The buffer layer may include an alloy of at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu, and at least one selected from the group consisting of Ag, Al, Mg, Cr, Mn, Fe, Co, Ni, Cu, In, Sn, Ru, Mo, and Nb.

The dipolar material may be a combination of a first component and a second component having different polarities, the first component including one selected from the group consisting of alkali metals, alkaline earth metals, rare earth metals and transition metals of the periodic table, and the second component including a halogen.

The organic light emitting diode may further include an electron transport layer between the light emission layer and the electron injection layer and a hole transport layer between the light emission layer and the first electrode, where the hole transport layer and the electron transport layer may each independently include an organic material.

The light emission layer may include a red light emission layer, a green light emission layer and a blue light emission layer, and further include an auxiliary layer below the blue light emission layer.

The organic light emitting diode may further include a red resonance auxiliary layer below the red light emission layer and a green resonance auxiliary layer below the green light emission layer.

The auxiliary layer may include a compound represented by Chemical Formula 1 below:

Chemical Formula 1

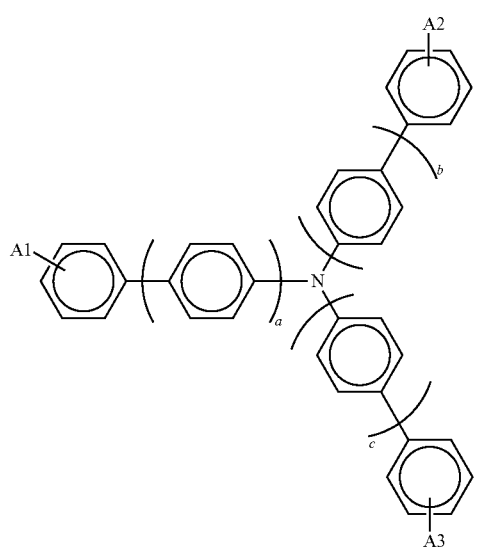

In Chemical Formula 1, each of A1, A2 and A3 includes an alkyl group, an aryl group, a carbazole group, a dibenzothiophene group, a dibenzofuran (DBF) group, or a biphenyl group, and each of a, b, and c is an integer of 0 to 4.

The auxiliary layer may include a compound represented by Chemical Formula 2 below:

Chemical Formula 2

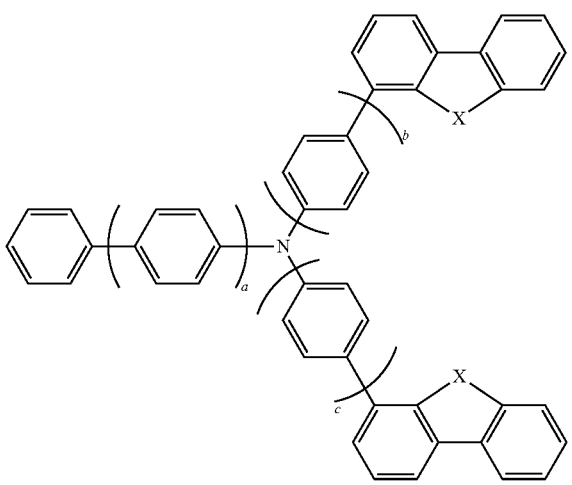

In Chemical Formula 2, a is 0 to 3, each of b and c is 0 to 3, and X is selected from O, N or S, and each X is the same as or different from each other X.

According to an example embodiment of the present disclosure, a light emitting efficiency may be increased by forming the electron injection layer including the dipolar material and the metal.

According to an example embodiment of the present disclosure, damage to the organic light emitting diode caused by a sputtering process at the time of forming a cathode may be reduced or prevented by forming the buffer layer including the metal having a low work function between the cathode and the electron injection layer.

According to an example embodiment of the present disclosure, light emitting efficiency of the blue light emission layer may be increased by forming the auxiliary layer below the blue light emission layer.

BRIEF DESCRIPTION OF THE DRAWINGS

The accompanying drawings, together with the specification, illustrate embodiments of the present disclosure, and, together with the description, serve to explain the principles of the present disclosure.

FIG. 4 is a table showing efficiency and current density characteristics of organic light emitting diode displays according to an example embodiment of the present disclosure and according to Comparative Examples 1-5.

DETAILED DESCRIPTION OF THE EMBODIMENTS

Figure 1:
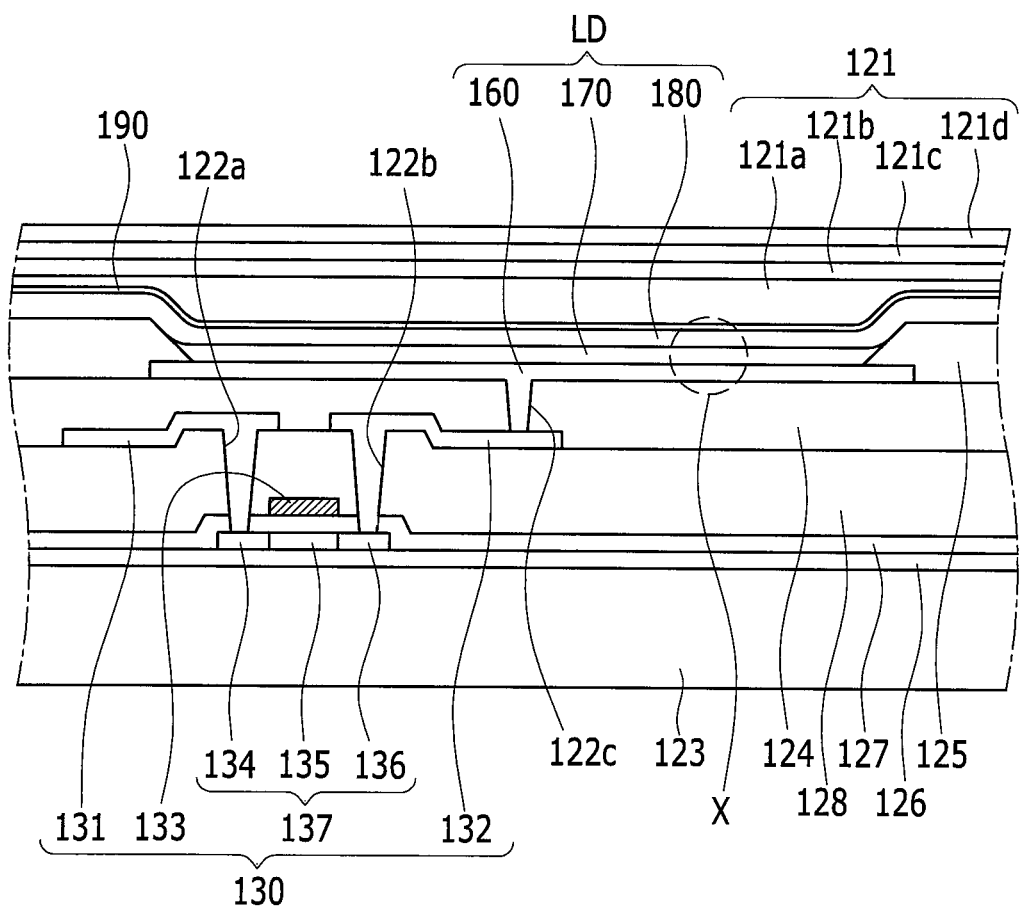
FIG. 1 is a cross-sectional view of an organic light emitting diode display according to an example embodiment of the present disclosure.

Hereinafter, example embodiments of the present disclosure will be described in detail with reference to the accompanying drawings. However, the present disclosure is not limited to the example embodiments which are described herein, and may be modified in various different ways. Indeed, the example embodiments of the present disclosure described below are provided so as to provide a thorough and complete description and fully convey the spirit of the present disclosure to those skilled in the art.

In the drawings, thicknesses of layers and regions may be exaggerated for clarity. In addition, in the context of the present application, in the case in which it is stated that a layer is present 'on' another layer or a substrate, the layer may be directly on the other layer or the substrate or be indirectly on the other layer or substrate and have other layers interposed therebetween. Further, in the context of the present application, when a first element is referred to as being "coupled" or "connected" to a second element, it can be directly coupled or connected to the second element or be indirectly coupled or connected to the second element with one or more intervening elements interposed therebetween. Portions denoted by like reference numerals designate like elements throughout the specification.

Figure 2:
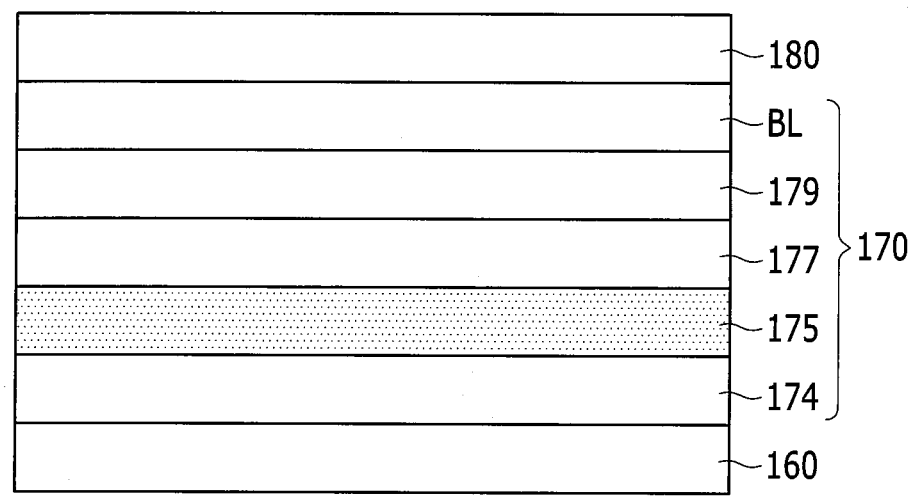
FIG. 2 is an expanded cross-sectional view of an organic light emitting diode of FIG. 1.

FIG. 1 is a cross-sectional view of an organic light emitting diode display according to an example embodiment of the present disclosure. FIG. 2 is an expanded cross-sectional view of an organic light emitting diode of FIG. 1.

Referring to FIGS. 1 and 2, an organic light emitting diode display according to an example embodiment of the present disclosure includes a substrate 123, a thin film transistor 130, a first electrode 160, a light emitting diode layer 170, and a second electrode 180 (the second electrode facing the first electrode). In some embodiments, the first electrode 160 may be an anode electrode, and the second electrode 180 may be a cathode electrode. In other embodiments, the first electrode 160 may be a cathode electrode and the second electrode 180 may be an anode electrode.

Here, the substrate 123 may be made of an inorganic material such as a glass or an organic material such as polycarbonate, polymethyl methacrylate, polyethylene terephthalate, polyethylene naphthalate, polyamide, polyimide, polyether sulfone or combinations thereof, a silicon wafer, and the like.

In addition, a substrate buffer layer 126 may be disposed on the substrate 123. The substrate buffer layer 126 serves to reduce or prevent penetration of impure elements into the substrate and to flatten (e.g., planarize) a surface of the substrate.

Here, the substrate buffer layer 126 may be made of various suitable materials capable of performing the functions of reducing or preventing the penetration of impurities into the substrate 123 and flattening the surface of the substrate 123. For example, any one of a silicon nitride (SiNx; $1 \leq x \leq 2$; e.g., x=1.33) layer, a silicon oxide (SiOy; $1 \leq y \leq 2$; e.g., y=2) layer, and a silicon oxynitride (SiOxNy; $1 \leq x \leq 2$; and $1 \leq y \leq 2$) layer may be used as the substrate buffer layer 126. However, the substrate buffer layer 126 is not necessarily a required component, and the substrate buffer layer 126 may be omitted according to kinds (e.g., composition) and process conditions (e.g., formation conditions) of the substrate 123.

A driving semiconductor layer 137 is formed on the substrate buffer layer 126 (or formed directly on the substrate 123). The driving semiconductor layer 137 may be made of a material including polysilicon. In addition, the driving semiconductor layer 137 includes a channel region 135 in which impurities are not doped, and a source region 134 and a drain region 136 formed by performing a doping process at both sides of the channel region 135. Here, as the doped ion materials, P type impurities such as boron (B), for example, B2H6 may be used. Here, the impurities may vary according to kinds (e.g., composition) of a thin film transistor.

A gate insulating layer 127 made of silicon nitride (SiNx; $1<x<2$; e.g., x=1.33), silicon oxide (SiOy; $1<y<2$; e.g., y=2), or the like, is disposed on the driving semiconductor layer 137. A gate wire including a driving gate electrode 133 is disposed on the gate insulating layer 127. In some embodiments, the driving gate electrode 133 is formed so as to overlap with at least one portion of the driving semiconductor layer 137, for example, the channel region 135.

Meanwhile, an interlayer insulating layer 128 substantially or completely covering the driving gate electrode 133 is formed on the gate insulating layer 127. A first contact hole 122a and a second contact hole 122b exposing a source region 134 and a drain region 136, respectively, of the driving semiconductor layer 137 are formed on the gate insulating layer 127 and the interlayer insulating layer 128. The interlayer insulating layer 128 may be made of a material such as silicon nitride (SiNx; $1<x<2$; e.g., x=1.33) or silicon oxide (SiOy; $1<y<2$; e.g., y=2), or the like, as similar to the gate insulating layer 127.

In addition, a data wire including a driving source electrode 131 and a driving drain electrode 132 may be disposed on the interlayer insulating layer 128. In addition, the driving source electrode 131 and the driving drain electrode 132 are coupled or connected to the source region 134 and the drain region 136, respectively, of the driving semiconductor layer 137 through the respective one of the first contact hole 122a and the second contact hole 122b formed in the interlayer insulating layer 128 and the gate insulating layer 127, respectively.

As described above, the driving thin film transistor 130 includes the driving semiconductor layer 137, the driving gate electrode 133, the driving source electrode 131 and the driving drain electrode 132. The configuration of the driving thin film transistor 130 is not limited to the above-described example, but may be modified to be in various suitable configurations capable of being easily practiced by those skilled in the art.

In addition, a planarization layer 124 substantially or completely covering the data wire is formed on the interlayer insulating layer 128. The planarization layer 124 serves to provide planarization of the data wire and the interlayer insulating layer 128 by removing steps (or defects) to increase light emitting efficiency of the organic light emitting diode to be formed thereon. In addition, the planarization layer 124 has a third contact hole 122c exposing a portion of the drain electrode 132.

The planarization layer 124 may be made of at least one material selected from the group consisting of an acryl-based resin (e.g., polyacrylate resin), an epoxy resin, a phenolic resin, a polyamide-based resin, a polyimide-based resin, an unsaturated polyester-based resin, a poly phenylene-based resin, a poly phenylenesulfide-based resin, and benzocyclobutene (BCB).

Here, an example embodiment according to the present disclosure is not limited to the above-described configuration, and in some cases, any one (or both) of the planarization layer 124 and the interlayer insulating layer 128 may be omitted.

Here, the first electrode 160 (e.g., a pixel electrode 160) of the organic light emitting diode is disposed on the planarization layer 124. For example, the organic light emitting diode display includes a plurality of pixel electrodes 160 disposed for a plurality of pixels (e.g., each of the pixel electrodes corresponding to a respective one of the pixels). Here, the plurality of pixel electrodes 160 are disposed so as to be spaced apart from each other. The pixel electrode 160 is coupled or connected to the drain electrode 132 through the third contact hole 122c of the planarization layer 124.

In addition, a pixel defining layer 125 in which an opening part exposing the pixel electrode 160 is formed is disposed on the planarization layer 124. For example, a plurality of opening parts may be formed in the pixel defining layer 125, and each of the opening parts may correspond to a respective one of the pixels. Here, a light emitting diode layer 170 may be disposed for each opening part formed by the pixel defining layer 125. Accordingly, a pixel area in which each light emitting diode layer 170 is formed may be defined by the pixel defining layer 125.

Here, the pixel electrode 160 is disposed to correspond to the opening part of the pixel defining layer 125. However, the pixel electrode 160 is not necessarily disposed only in the opening part of the pixel defining layer 125, and a portion of the pixel electrode 160 may be disposed below the pixel defining layer 125 so as to overlap with the pixel defining layer 125.

The pixel defining layer 125 may be made of a polyacrylate-based resin, a polyimide-based resin, and/or the like, and/or a silicon-based inorganic material, and/or the like.

Meanwhile, the light emitting diode layer 170 is disposed on the pixel electrode 160. Hereinafter, a structure of the light emitting diode layer 170 is described in more detail.

The second electrode 180 (e.g., a common electrode 180) may be disposed on the light emitting diode layer 170. As described above, an organic light emitting diode (LD) including the pixel electrode 160, the light emitting diode layer 170, and the common electrode 180 is formed.

Here, the pixel electrode 160 and the common electrode 180 may be made of a transparent conductive material, a transflective conductive material or a reflective conductive material, respectively. According to kinds of the material for forming the pixel electrode 160 and the common electrode 180, the organic light emitting diode display may be a top light emission type (or kind) of display, a bottom light emission type (or kind) of display, or a double sided light emission type (or kind) of display.

The common electrode 180 corresponding to the second electrode included in the organic light emitting diode according to an example embodiment of the present disclosure may include at least one selected from the group consisting of Ag, Al, Mg, Cr, Mn, Fe, Co, Ni, Cu, In, Sn, Ru, Mo and Nb. In the present example embodiment, the common electrode 180 may be deposited by a sputtering method.

Meanwhile, an overcoat layer 190 substantially or completely covering the common electrode 180 for protection may be formed as an organic layer on the common electrode 180.

In addition, a thin film encapsulation layer 121 is formed on the overcoat layer 190. The thin film encapsulation layer 121 encapsulates and protects the organic light emitting diode (LD) and a driving circuit part formed on or above the substrate 123 from the outside (e.g., from water and air).

The thin film encapsulation layer 121 includes encapsulation organic layers 121a and 121c and encapsulation inorganic layers 121b and 121d which are alternately stacked one by one. A case in which the encapsulation organic layers 121a and 121c and the encapsulation inorganic layers 121b and 121d are alternately stacked one by one to form the thin film encapsulation layer 121 is shown in FIG. 1 by way of example. However, the thin film encapsulation layer is not limited thereto.

Hereinafter, the organic light emitting diode according to an example embodiment of the present disclosure is described with reference to FIG. 2.

Referring to FIG. 2, the organic light emitting diode (the portion denoted by the circle X in FIG. 1) according to an example embodiment of the present disclosure includes a structure in which the first electrode 160, a hole transport layer 174, a light emission layer 175, an electron transport layer 177, an electron injection layer 179 and the second electrode 180 are sequentially stacked (e.g., stacked in the stated order).

When the first electrode 160 is an anode, a material of the first electrode 160 may be selected from materials having a high work function so that hole injection is easily performed. The first electrode 160 may be a transparent electrode or a non-transparent electrode (e.g., a reflective electrode). When the first electrode 160 is a transparent electrode, the first electrode 160 may be formed to a thin thickness by using a conductive oxide such as indium tin oxide (ITO), indium zinc oxide (IZO), tin oxide ($SnO_2$), zinc oxide (ZnO) or a combination thereof or a metal such as aluminum, silver, and/or magnesium. When the first electrode 160 is a non-transparent electrode, the first electrode 160 may be formed by using a metal such as aluminum, silver, and/or magnesium.

The first electrode 160 may be formed to have a layered structure (e.g., to include two or more layers) including different kinds of materials. For example, the first electrode 160 may be formed to have a structure in which indium tin oxide (ITO), silver (Ag), and indium tin oxide (ITO) are sequentially stacked.

The first electrode 160 may be formed by using a sputtering method, a vacuum deposition method, or the like.

The hole transport layer 174 is disposed on the first electrode 160. The hole transport layer 174 may serve to smoothly transport holes delivered from the hole injection layer 172. The hole transport layer 174 may include an organic material. For example, the hole transport layer 174 may include N,N-dinaphthyl-N,N'-diphenyl benzidine (NPD), N,N'-bis-(3-methylphenyl)-N,N'-bis-(phenyl)benzidine (TPD), s-TAD, 4,4',4"-tris(N-3-methylphenyl-N-phenyl-amino)-triphenylamine (MTDATA), and the like, but the hole transport layer is not limited thereto.

Here, the hole transport layer 174 may have a thickness of 15 nm to 25 nm. For example, the hole transport layer 174 may have a thickness of 20 nm. The hole transport layer 174 may be formed to be a hole transport/hole injection layer including hole injection materials by modifying the hole transport layer 174 described in the present example embodiment. The hole transport/hole injection layer may be formed as a single layer.

The light emission layer 175 is disposed on the hole transport layer 174. The light emission layer 175 includes a light emission material displaying a certain color. For example, the light emission layer 175 may display a basic color such as blue, green, or red, or a combination thereof.

The light emission layer 175 may have a thickness of 10 nm to 50 nm. The light emission layer 175 includes a host and a dopant. The light emission layer 175 may include a material that emits red, green, blue, and/or white light, and may be formed by using a phosphorescent material or a fluorescent material.

When the light emission layer 175 emits red light, the light emission layer 175 may be made of the phosphorescent material including the host material including carbazole biphenyl (CBP) or 1,3-bis(carbazol-9-yl) (mCP), and at least any one dopant selected from the group consisting of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium) and PtOEP (octaethylporphyrin platinum), and on the other hand, may be made of fluorescent material including PBD:Eu(DBM)3 (Phen) or Perylene, but the light emission layer is not limited thereto.

When the light emission layer 175 emits green light, the light emission layer 175 may be made of the phosphorescent material including the host material including CBP or mCP and including the dopant material including Ir(ppy)3(fac-tris(2-phenylpyridine)iridium), and on the other hand, may be made of the fluorescent material including Alq3(tris(8-hydroxyquinolino)aluminum), but the light emission layer is not limited thereto.

When the light emission layer 175 emits blue light, the light emission layer 175 may be made of the phosphorescent material including the host material including CBP or mCP, and the dopant material including (4,6-F2ppy)2Irpic. On the other hand, the light emission layer 175 may be made of the fluorescent material including any one selected from the group consisting of spiro-DPVBi, spiro-6P, distyryl benzene (DSB), distyryl arylene (DSA), a PFO-based polymer and a PPV-based polymer, but the light emission layer is not limited thereto.

The electron transport layer 177 is disposed on the light emission layer 175. The electron transport layer 177 may deliver electrons from the second electrode 180 to the light emission layer 175. In addition, the electron transport layer 177 may prevent holes injected from the first electrode 160 from passing through the light emission layer 175 and moving to the second electrode 180 (or may reduce such movement of the holes). For example, the electron transport layer 177 serves as a hole block layer to help facilitate the combination of the holes and the electrons in the light emission layer 175.

Here, the electron transport layer 177 may include an organic material. For example, the electron transport layer 177 may be made of at least any one selected from the group consisting of Alq3(tris(8-hydroxyquinolino)aluminum), PBD, TAZ, spiro-PBD, BAlq and SAlq, but the electron transport layer is not limited thereto.

The electron injection layer 179 is disposed on the electron transport layer 177. The electron injection layer 179 may facilitate electron injection from the second electrode 180 to the electron transport layer 177. In the present example embodiment, the electron injection layer 179 includes a dipolar material and a first metal. Here, the dipolar material and the first metal may be co-deposited to form one layer. The first metal may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm and Lu.

The dipolar material is a combination of a first component and a second component having different polarities, the first component including one selected from the group consisting of alkali metals, alkaline earth metals, rare earth metals and transition metals of the periodic table of elements, and the second component including a halogen. For example, the first component may be one element selected from the group consisting of Li, Na, K, Rb, Cs, Be, Mg, Ca, Sr and Ba, and the second component may be one element selected from the group consisting of F, Cl, Br and I. Here, the first component may be an element which becomes a positive ion (a cation) and the second component may be an element which becomes a negative ion (an anion) when the dipolar material is ionized.

In the present example embodiment, a thickness of the electron injection layer 179 has a minimum value of 5 angstroms (Å) in consideration of a process margin, and has a maximum value of 50 angstroms (Å) in consideration of difficulty in performing a function as the electron injection layer, and therefore, the electron injection layer 179 has a thickness of 5 angstroms (Å) to 50 angstroms (Å). However, a thickness of the electron injection layer may be 10 angstroms (Å) to 20 angstroms (Å).

A buffer layer (BL) is disposed on the electron injection layer 179. The buffer layer (BL) according to an example embodiment of the present disclosure may include a metal having work function of 4.0 eV or less. The buffer layer may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm and Lu. In another example embodiment, the buffer layer may include an alloy of at least one selected from the group consisting of Yb, Mg, Li, Na, Ca, Sr, Ba, In, Sn, La, Ce, Pr, Nd, Pm, Eu, Gd, Tb, Dy, Ho, Er, Sm and Lu and at least one selected from the group consisting of Ag, Al, Mg, Cr, Mn, Fe, Co, Ni, Cu, In, Sn, Ru, Mo and Nb.

In the present example embodiment, a thickness of the buffer layer (BL) has a minimum value of 5 angstroms (Å) in consideration of a process margin, and has a maximum value of 100 angstroms (Å) for electron injection, and therefore, the buffer layer (BL) has a thickness of 5 angstroms (Å) to 100 angstroms (Å). However, a thickness of the electron injection layer may be 10 angstroms (Å) to 40 angstroms (Å).

The second electrode 180 is disposed on the buffer layer (BL). The common electrode 180 corresponding to the second electrode included in the organic light emitting diode according to an example embodiment of the present disclosure may include at least one selected from the group consisting of Ag, Al, Mg, Cr, Mn, Fe, Co, Ni, Cu, In, Sn, Ru, Mo and Nb. A thickness of the common electrode may be about 30 angstroms (Å) to 300 angstroms (Å). In the present example embodiment, the common electrode 180 may be deposited by a sputtering method.

Figure 3:
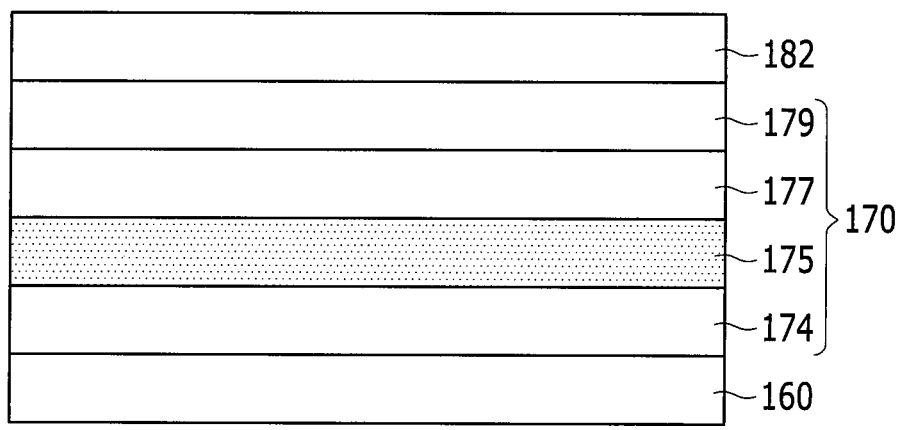
FIG. 3 is a cross-sectional view of a partially modified example embodiment of the organic light emitting diode of FIG. 2.

FIG. 3 is a cross-sectional view of a partially modified example embodiment of the organic light emitting diode of FIG. 2.

Referring to FIG. 3, a cathode 182 structure in which a buffer layer (BL) and a cathode 182 of the organic light emitting diode (LD) according to the example embodiment of FIG. 2 are formed to be one composite layer is shown. In the present example embodiment, the cathode 182 may include an alloy of a first material including at least one selected from the group consisting of Yb, Mg, Li, Na, Ca, Sr, Ba, In, Sn, La, Ce, Pr, Nd, Pm, Eu, Gd, Tb, Dy, Ho, Er, Sm and Lu and a second material including at least one selected from the group consisting of Ag, Al, Mg, Cr, Mn, Fe, Co, Ni, Cu, In, Sn, Ru, Mo and Nb. The cathode 182 may be formed by co-deposition of the first material and the second material.

The descriptions with respect to FIG. 2 may also be applied to the example embodiment of FIG. 3, except for the above-described differences. Thus, further description of the features of FIG. 3 that may be the same or substantially the same as the corresponding features of FIG. 2 will not be repeated here.

FIG. 4 is a table showing efficiency and current density characteristics of the organic light emitting diode display according to an example embodiment of the present disclosure.

In FIG. 4, Comparative Example 1, Comparative Example 2 and Comparative Example 3 correspond to cases in which the electron injection layers are made of Liq, Yb and Yb:LiF, respectively, without forming the buffer layer, and the cathodes are made of MgAg having a thickness of 90 angstroms (Å) (Comparative Example 1) or Ag having a thickness of 90 angstroms (Å) (Comparative Examples 2 and 3). Comparative Example 4 corresponds to a case in which the buffer layer is made of LiF, the electron injection layer is made of Yb, and the cathode is made of Ag having a thickness of 90 angstroms (Å). Comparative Example 5 corresponds to a case in which the buffer layer is made of Yb:LiF having a thickness of 20 angstroms (Å), the electron injection layer is made of Yb having a thickness of 50 angstroms (Å), and the cathode is made of Ag having a thickness of 150 angstroms (Å).

The Example of the present disclosure corresponds to a case in which the buffer layer is made of Yb:LiF having a thickness of 20 angstroms (Å), the electron injection layer is made of Yb having a thickness of 50 angstroms (Å), and the cathode is made of Ag having a thickness of 150 angstroms (Å).

Here, all thin films (for example: cathodes) of Comparative Example 1 to Comparative Example 5 are formed by a vertical thermal evaporation (VTE) method, and a thin film (for example: cathode) of the example embodiment is formed by a sputtering method.

Referring to FIG. 4, it may be confirmed that as compared to Comparative Examples 1 to 5, efficiency (efficiency of a blue diode) in the Example of the present disclosure is improved while maintaining the same current density as Comparative Examples 1 to 5.

Figure 5:
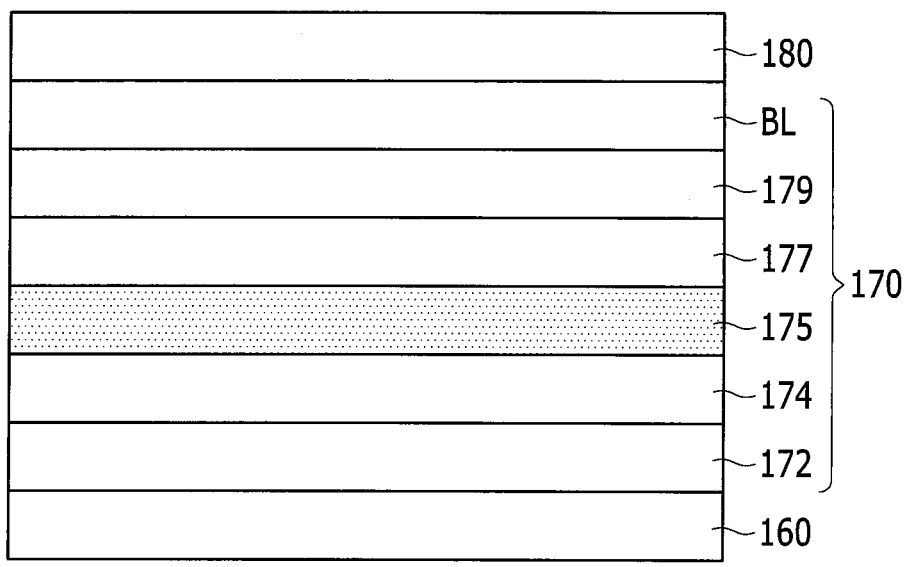
FIGS. 5 and 6 are cross-sectional views of partially modified example embodiments of the organic light emitting diode of FIG. 2.
Figure 6:
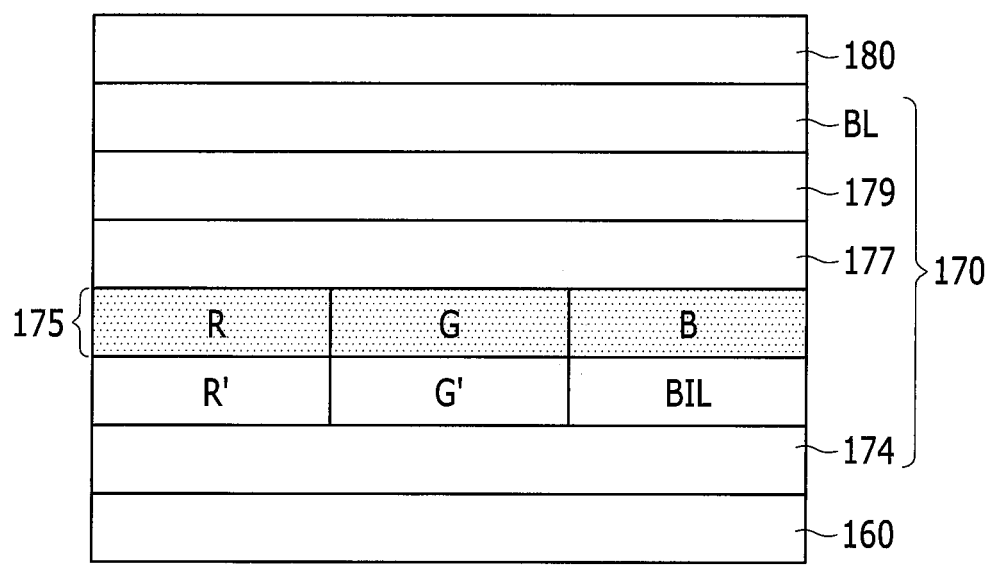

FIGS. 5 and 6 are cross-sectional views of partially modified example embodiments of the organic light emitting diode of FIG. 2.

Referring to FIG. 5, a structure in which a hole injection layer 172 is added to the organic light emitting diode (LD) according to the example embodiment of FIG. 2 is shown. In the present example embodiment, the hole injection layer 172 is disposed between the hole transport layer 174 and the first electrode 160. The hole injection layer 172 allows holes to be easily injected from the first electrode 160 to the hole transport layer 174. The hole injection layer 172 in the present example embodiment may include a dipolar material in which a metal or a non-metal having a work function of 4.3 eV or more is combined with a halogen. However, the hole injection layer 172 is not limited in view of the forming materials, and may be made of other inorganic materials or organic materials.

The metal or non-metal having a work function of 4.3 eV or more may be one element selected from the group consisting of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W and Zn.

The descriptions with respect to FIG. 2 may also be applied to the example embodiment of FIG. 5 except for the above-described differences. Thus, further description of the features of FIG. 5 that may be the same or substantially the same as the corresponding features of FIG. 2 will not be repeated here.

Referring to FIG. 6, a modified example embodiment in which the light emission layer 175 of the organic light emitting diode (LD) shown in FIG. 2 is modified is shown. For example, the light emission layer 175 in the present example embodiment may include a red light emission layer (R), a green light emission layer (G) and a blue light emission layer (B), and an auxiliary layer BIL for increasing efficiency of the blue light emission layer (B) may be disposed below the blue light emission layer (B).

The red light emission layer (R) may have a thickness of about 30 nm to 50 nm, the green light emission layer (G) may have a thickness of about 10 nm to 30 nm, and the blue light emission layer (B) may have a thickness of about 10 nm to 30 nm. The auxiliary layer (BIL) disposed below the blue light emission layer (B) may have a thickness of about 20 nm or less. The auxiliary layer (BIL) may serve to increase an efficiency of the blue light emission layer (B) by controlling hole charge balance. The auxiliary layer (BIL) may include a compound represented by Chemical Formula 1 below:

Chemical Formula 1

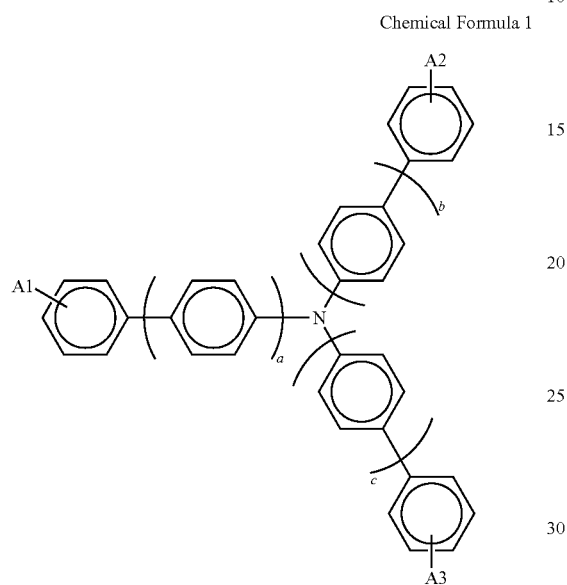

In Chemical Formula 1, each of A1, A2 and A3 may include an alkyl group, an aryl group, a carbazole group, a dibenzothiophene group, a dibenzofuran (DBF) group, or a biphenyl group, and each of a, b, and c may be an integer of 0 to 4.

Examples of the compound represented by Chemical Formula 1 above may include compounds represented by Chemical Formulas 1-1, 1-2, 1-3, 1-4, 1-5, and 1-6 below:

Chemical Formula 1-1

Chemical Formula 1-2

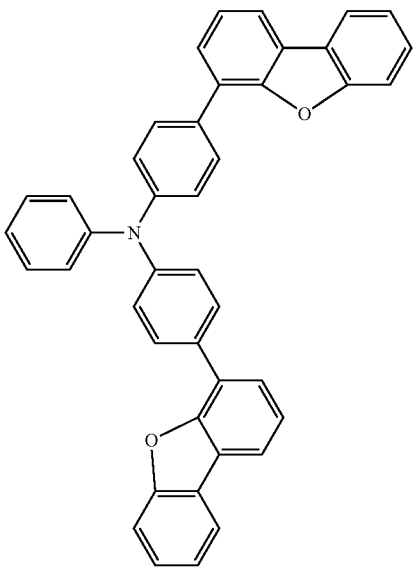

Chemical Formula 1-3

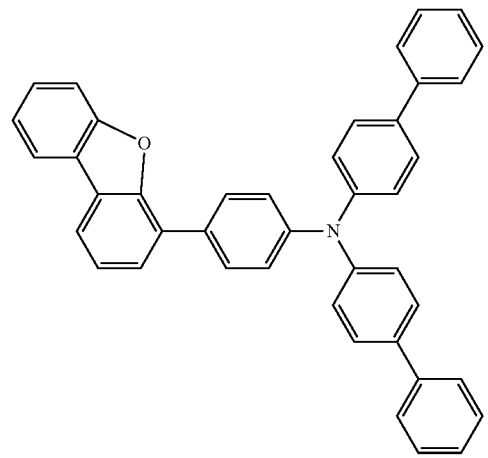

Chemical Formula 1-4

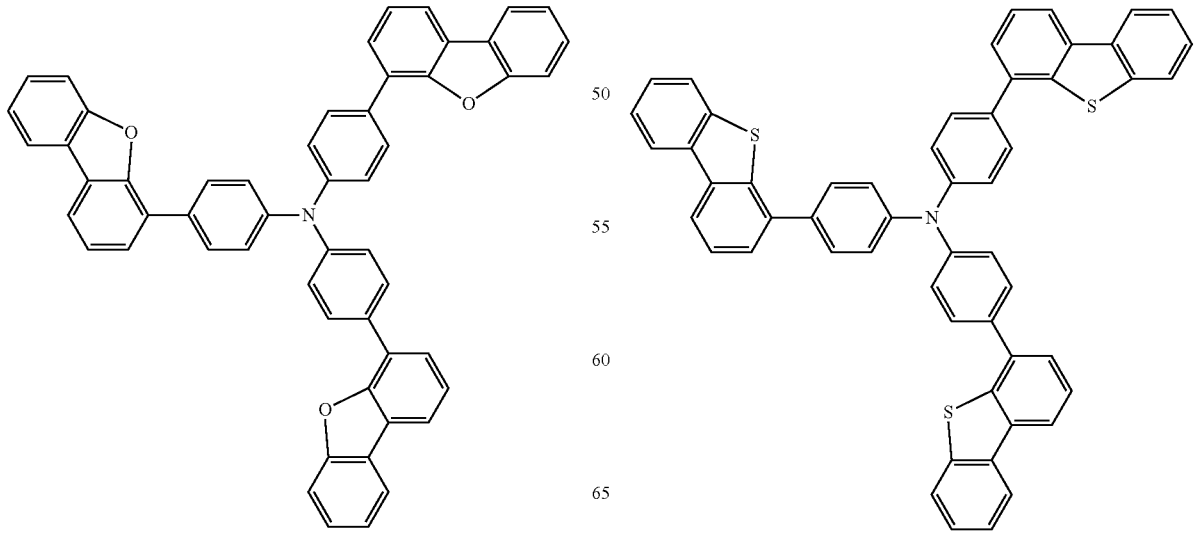

-continued

Chemical Formula 1-5

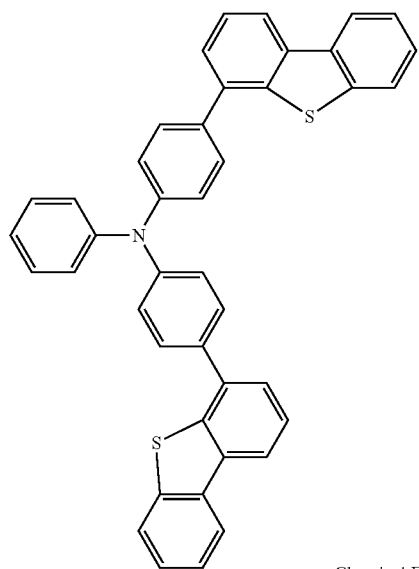

Chemical Formula 1-6

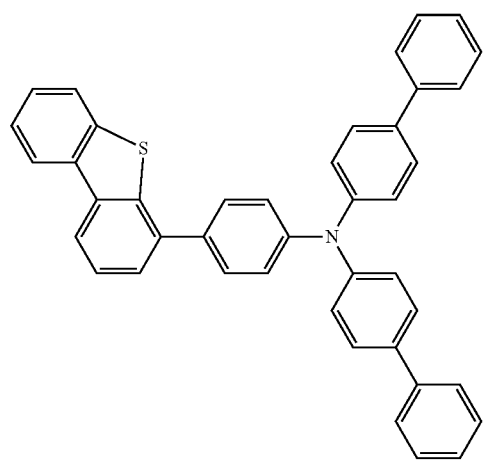

According to another example embodiment, the auxiliary layer (BIL) may include a compound represented by Chemical Formula 2 below:

Chemical Formula 2

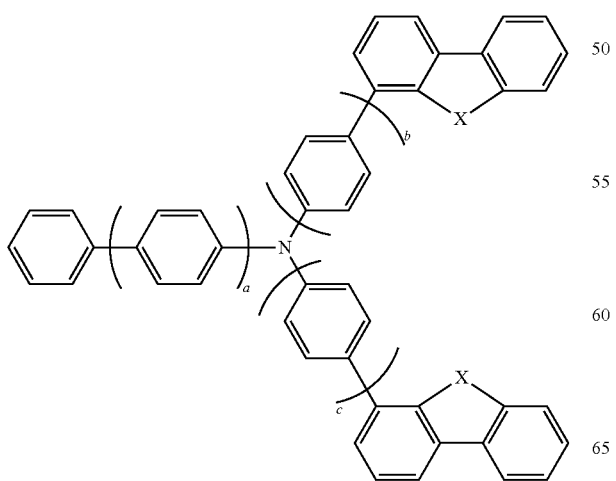

In Chemical Formula 2, a may be 0 to 3, b and c each may be 0 to 3, and X may be selected from O, N or S, and each X may be the same as each other or different from each other (e.g., the same as or different from each other X).

Examples of the compound represented by Chemical Formula 2 may include compounds represented by Chemical Formulas 2-1 to 2-6 below:

Chemical Formula 2-1

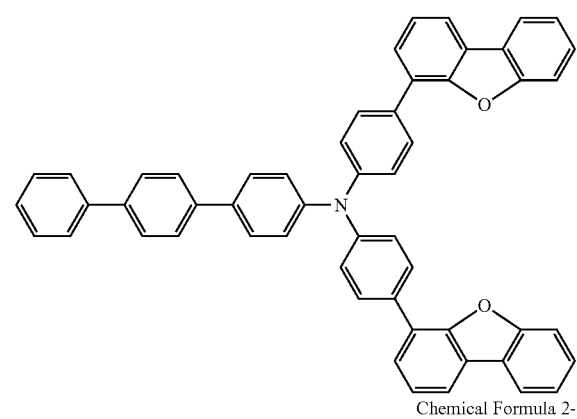

Chemical Formula 2-2

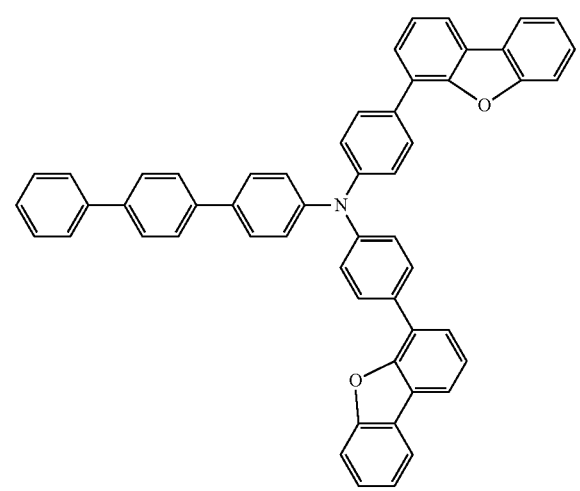

Chemical Formula 2-3

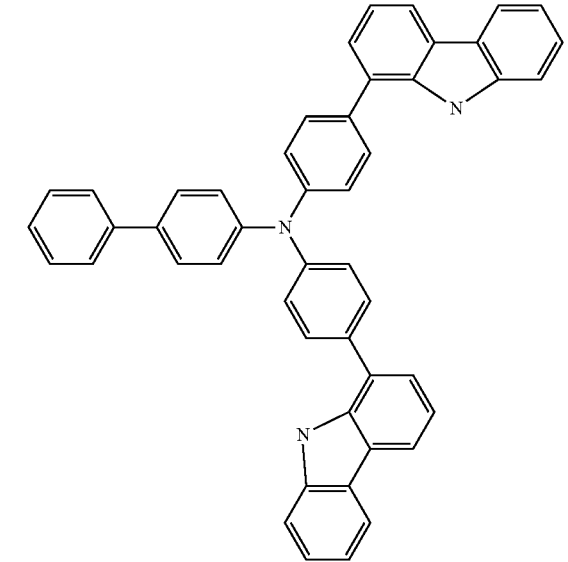

Chemical Formula 2-4

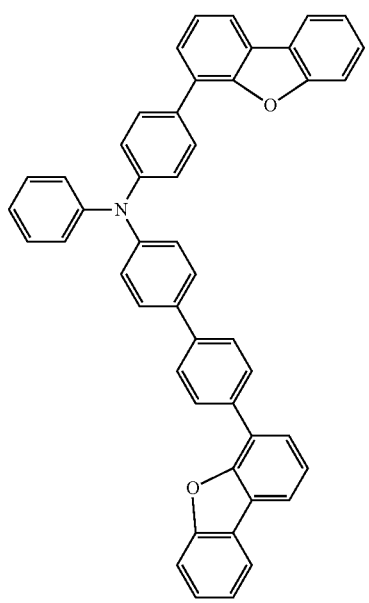

Chemical Formula 2-5

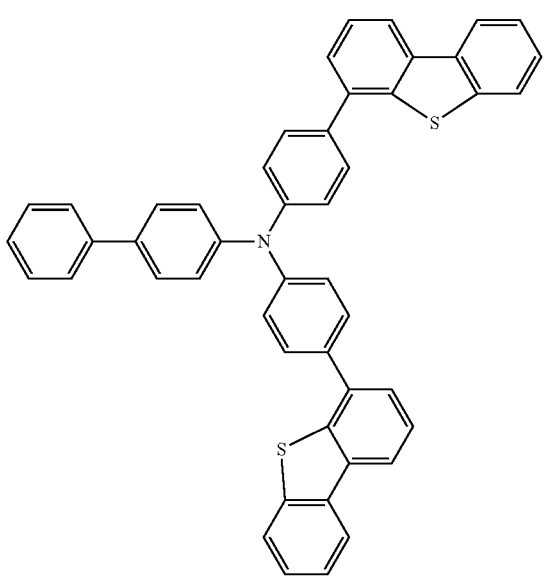

Chemical Formula 2-6

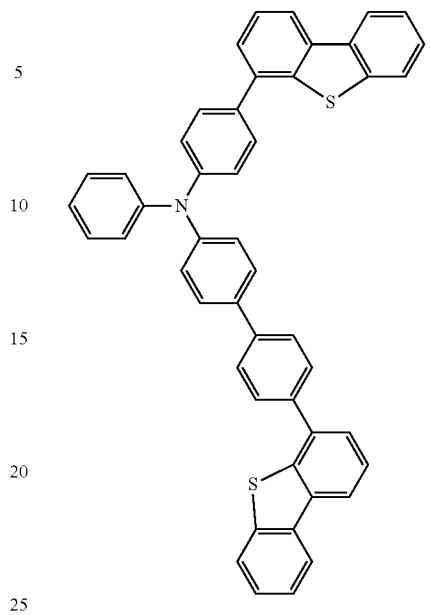

According to another example embodiment, the auxiliary layer (BIL) may include a compound represented by Chemical Formula 3 below:

Chemical Formula 3

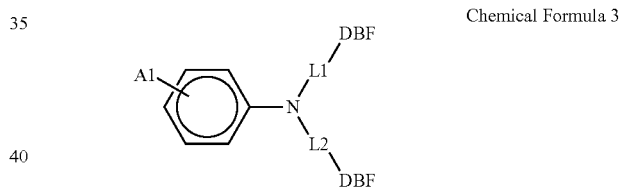

In Chemical Formula 3, A1 may be an alkyl group, an aryl group, a carbazole group, a dibenzothiophene group, or a dibenzofuran (DBF) group, L1 and L2 each may be

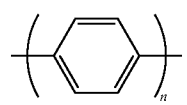

(n is 0 to 3), and the DBF coupled or connected to a respective one of L1 and L2 may be substituted with a carbazole group or a dibenzothiophene group.

Hereinafter, a synthesis method of the auxiliary layer (BIL) according to an example embodiment of the present disclosure is described. For example, a synthesis method of Chemical Formula 1-1 below is described.

Chemical Formula 1-1

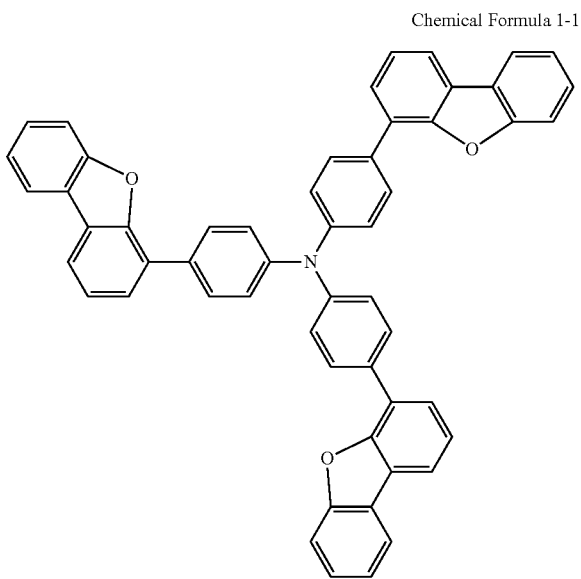

Synthetic Example 4-dibenzofuran boronic acid (6.3 g), 4,4',4''-tribromotriphenyl amine (4.8 g), tetrakis(triphenylphosphine)palladium (Pd PPh$_3$)$_4$) (104 mg), 2M sodium carbonate (Na$_2$CO$_3$) solution (48 ml), and toluene (48 ml) were put into a three-necked flask (300 milliliter) under an argon atmosphere, and reacted at 80° C. for 8 hours. The reaction solution was extracted with toluene/water, and dried over anhydrous sodium sulfate to obtain a product. The obtained product was concentrated under reduced pressure, and the obtained crude product was column-purified to obtain an off-white powder (3.9 g).

As shown in FIG. 6, a red resonance auxiliary layer (R') may be disposed below the red light emission layer (R), and a green resonance auxiliary layer (G') may be disposed below the green light emission layer (G). The red resonance auxiliary layer (R') and the green resonance auxiliary layer (G') are layers that set a resonant distance (a resonance distance) for a respective one of the colors (e.g., red or green). In some embodiments, a blue resonance auxiliary layer is not included. For example, a separate resonance auxiliary layer disposed between the hole transport layer 174 and the blue light emission layer (B) (and between the hole transport layer 174 and the auxiliary layer (BIL)) may not be formed below the blue light emission layer (B) and the auxiliary layer (BIL) corresponding to the red light emission layer (R) or the green light emission layer (G). In some embodiments, the BIL physically contacts the hole transport layer 174.

In the embodiment shown in FIG. 6, the hole injection layer 172 may be formed between the first electrode 160 and the hole transport layer 174 as shown in the example embodiment of FIG. 5.

The descriptions according to FIG. 2 may also be applied to an example embodiment of FIG. 6 except for the above-described differences.

While embodiments of the present disclosure have been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims, and equivalents thereof.

| Description of some of the symbols | | | |
|---|---|---|---|
| 160, 260 | first electrode | 172, 272 | hole injection layer |
| 174, 274 | hole transport layer | 175, 275 | light emission layer |
| 177, 277 | electron transport layer | 179, 279 | electron injection layer |
| 180, 280 | second electrode | BIL | auxiliary layer |

What is claimed is:

1. An organic light emitting diode comprising:
a first electrode;
a second electrode facing the first electrode;
a light emission layer between the first electrode and the second electrode;
an electron injection layer between the second electrode and the light emission layer; and
a buffer layer between the electron injection layer and the second electrode,
wherein the electron injection layer comprises a dipolar material comprising a combination of a first component and a second component having different polarities and a first metal that is distinct from the first component and the second component,
wherein the first component comprises one selected from the group consisting of alkali metals, alkaline earth metals, rare earth metals, and transition metals of the periodic table, and
the buffer layer comprises a metal having a work function of 4.0 eV or less.

2. The organic light emitting diode of claim 1, wherein:
the dipolar material and the first metal are co-deposited to form one layer.

3. The organic light emitting diode of claim 2, wherein:
the first metal comprises at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

4. The organic light emitting diode of claim 3, wherein:
the second electrode comprises at least one selected from the group consisting of Ag, Al, Mg, Cr, Mn, Fe, Co, Ni, Cu, In, Sn, Ru, Mo, and Nb.

5. The organic light emitting diode of claim 4, wherein:
the buffer layer comprises at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

6. The organic light emitting diode of claim 5, wherein:
the buffer layer comprises an alloy of at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu, and at least one selected from the group consisting of Ag, Al, Mg, Cr, Mn, Fe, Co, Ni, Cu, In, Sn, Ru, Mo, and Nb.

7. The organic light emitting diode of claim 1, wherein:
the second component comprises a halogen.

8. The organic light emitting diode of claim 1, further comprising:
an electron transport layer between the light emission layer and the electron injection layer and a hole transport layer between the light emission layer and the first electrode,
wherein the hole transport layer and the electron transport layer each independently comprise an organic material.

9. The organic light emitting diode of claim 1, wherein:
the light emission layer comprises a red light emission layer, a green light emission layer and a blue light emission layer, and further comprises an auxiliary layer below the blue light emission layer.

10. The organic light emitting diode of claim 9, further comprising:
a red resonance auxiliary layer below the red light emission layer and a green resonance auxiliary layer below the green light emission layer.

11. The organic light emitting diode of claim 9, wherein:
the auxiliary layer comprises a compound represented by Chemical Formula 1 below:

Chemical Formula 1

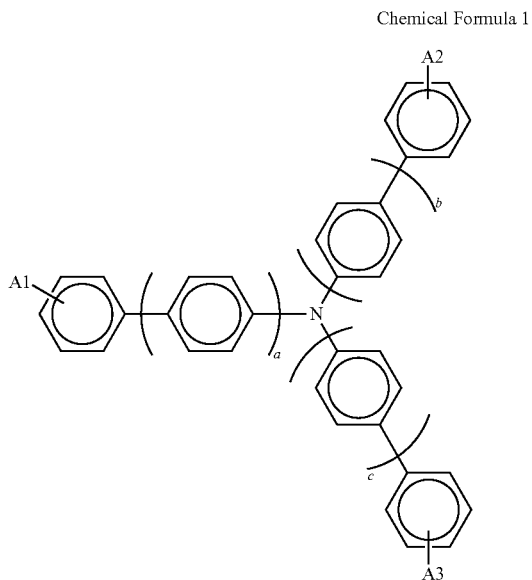

in Chemical Formula 1, each of A1, A2 and A3 comprises an alkyl group, an aryl group, a carbazole group, a dibenzothiophene group, a dibenzofuran (DBF) group, or a biphenyl group, and each of a, b, and c is an integer of 0 to 4.

12. The organic light emitting diode of claim 9, wherein:
the auxiliary layer comprises a compound represented by Chemical Formula 2 below:

Chemical Formula 2

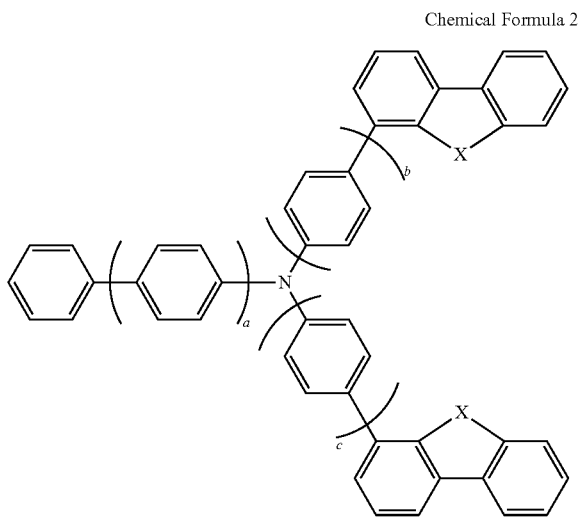

in Chemical Formula 2, a is 0 to 3, each of b and c is 0 to 3, and X is selected from O, N or S, and each X is the same as or different from each other X.

13. An organic light emitting diode display comprising:
a substrate;
a thin film transistor on the substrate; and
an organic light emitting diode on the thin film transistor and coupled to the thin film transistor,
wherein the organic light emitting diode comprises:
a first electrode;
a second electrode facing the first electrode;
a light emission layer between the first electrode and the second electrode;
an electron injection layer between the second electrode and the light emission layer, and
a buffer layer between the electron injection layer and the second electrode,
the electron injection layer comprising a dipolar material comprising a combination of a first component and a second component having different polarities and a first metal that is distinct from the first component and the second component,
the first component comprising one selected from the group consisting of alkali metals, alkaline earth metals, rare earth metals and transition metals of the periodic table, and
the buffer layer comprising a metal having a work function of 4.0 eV or less.

14. The organic light emitting diode display of claim 13, wherein:
the dipolar material and the first metal are co-deposited to form one layer.

15. The organic light emitting diode display of claim 14, wherein:
the first metal comprises at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

16. The organic light emitting diode display of claim 15, wherein:
the second electrode comprises at least one selected from the group consisting of Ag, Al, Mg, Cr, Mn, Fe, Co, Ni, Cu, In, Sn, Ru, Mo, and Nb.

17. The organic light emitting diode display of claim 16, wherein:
the buffer layer comprises at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

18. The organic light emitting diode display of claim 17, wherein:
the buffer layer comprises an alloy of at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu, and at least one selected from the group consisting of Ag, Al, Mg, Cr, Mn, Fe, Co, Ni, Cu, In, Sn, Ru, Mo, and Nb.

19. The organic light emitting diode display of claim 13, wherein:
the second component comprises a halogen.

20. The organic light emitting diode display of claim 13, further comprising:
an electron transport layer between the light emission layer and the electron injection layer and a hole transport layer between the light emission layer and the first electrode,
wherein the hole transport layer and the electron transport layer each independently comprise an organic material.

21. The organic light emitting diode display of claim 13, wherein:
the emission layer comprises a red light emission layer, a green light emission layer and a blue light emission layer, and
further comprises an auxiliary layer below the blue light emission layer.

22. The organic light emitting diode display of claim 21, further comprising:
a red resonance auxiliary layer below the red light emission layer and a green resonance auxiliary layer below the green light emission layer.

23. The organic light emitting diode display of claim 21, wherein:
the auxiliary layer comprises a compound represented by Chemical Formula 1 below:

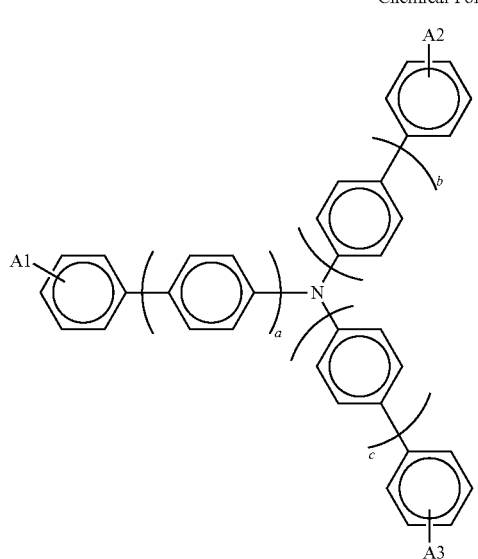

Chemical Formula 1 in Chemical Formula 1, each of A1, A2 and A3 comprises an alkyl group, an aryl group, a carbazole group, a dibenzothiophene group, a dibenzofuran (DBF) group, or a biphenyl group, and each of a, b, and c is an integer of 0 to 4.

24. The organic light emitting diode display of claim 21, wherein:
the auxiliary layer comprises a compound represented by Chemical Formula 2 below:

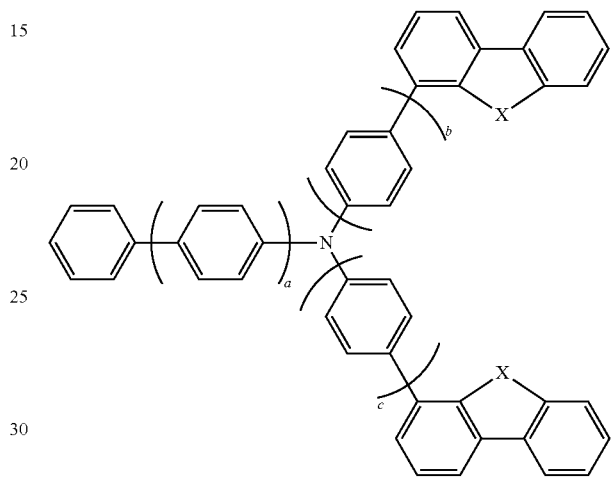

Chemical Formula 2 in Chemical Formula 2, a is 0 to 3, each of b and c is 0 to 3, and X is selected from O, N or S, and each X is the same as or different from each other X.

* * * * *